(12) United States Patent
Wakabayashi et al.

(10) Patent No.: US 8,357,859 B2
(45) Date of Patent: Jan. 22, 2013

(54) INSULATING RESIN SHEET LAMINATE AND MULTI-LAYER PRINTED CIRCUIT BOARD INCLUDING INSULATING RESIN SHEET LAMINATE

(75) Inventors: Hiroaki Wakabayashi, Saitama (JP); Noriyuki Ohigashi, Fujieda (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 371 days.

(21) Appl. No.: 12/523,127

(22) PCT Filed: Jan. 16, 2008

(86) PCT No.: PCT/JP2008/050429
§ 371 (c)(1),
(2), (4) Date: Jul. 14, 2009

(87) PCT Pub. No.: WO2008/087972
PCT Pub. Date: Jul. 24, 2008

(65) Prior Publication Data
US 2010/0101843 A1 Apr. 29, 2010

(30) Foreign Application Priority Data
Jan. 16, 2007 (JP) .................................. 2007-006615

(51) Int. Cl.
*H05K 1/00* (2006.01)
(52) U.S. Cl. .................. 174/258; 361/792; 174/262
(58) Field of Classification Search .......... 361/792–795; 174/255–266
See application file for complete search history.

(56) References Cited

U.S. PATENT DOCUMENTS

| 6,663,946 | B2* | 12/2003 | Seri et al. ....................... 428/209 |
| 7,556,850 | B2* | 7/2009 | Ikishima et al. .............. 428/41.5 |
| 2004/0234741 | A1 | 11/2004 | Hosomi et al. |
| 2005/0117217 | A1* | 6/2005 | Yamaoka et al. ............. 359/483 |
| 2009/0126974 | A1 | 5/2009 | Yuasa et al. |
| 2010/0032200 | A1* | 2/2010 | Hirose et al. ................... 174/261 |

FOREIGN PATENT DOCUMENTS

| JP | 7-76663 | 3/1995 |
| JP | 7 106767 | 4/1995 |
| JP | 8 18239 | 1/1996 |
| JP | 2000 169672 | 6/2000 |
| JP | 2002 540235 | 11/2002 |
| JP | 2005 101269 | 4/2005 |

(Continued)

OTHER PUBLICATIONS

Office Action issued Jul. 11, 2011 in Chinese Patent Application No. 200880002227.2 (with English translation).

*Primary Examiner* — Jeremy Norris
(74) *Attorney, Agent, or Firm* — Oblon, Spivak, McClelland, Maier & Neustadt, L.L.P.

(57) ABSTRACT

Disclosed is an insulating resin sheet laminate (an insulating resin sheet with a film or a metal foil) including an insulating resin layer with a uniform thickness that is formed without repulsion or unevenness in a process of forming the insulating resin layer on a film or a metal foil, and a multi-layer printed circuit board that includes the insulating resin sheet laminate and possesses high insulating reliability. The present invention provides an insulating resin sheet laminate (an insulating resin sheet with a film or a metal foil) obtained by forming an insulating resin layer made of a resin composition on a film or a metal foil, and the resin composition includes an acrylic surfactant.

19 Claims, 4 Drawing Sheets

FOREIGN PATENT DOCUMENTS

| | | |
|---|---|---|
| JP | 2006 321229 | 11/2006 |
| WF | 2008 044552 | 4/2008 |
| WO | 03 018675 | 3/2003 |
| WO | WO 2006/090662 A1 | 8/2006 |
| WO | 2007 040125 | 4/2007 |
| WO | 2007 046316 | 4/2007 |
| WO | 2007 108087 | 9/2007 |
| WO | 2008 044552 | 4/2008 |

* cited by examiner

INSULATING RESIN SHEET LAMINATE AND MULTI-LAYER PRINTED CIRCUIT BOARD INCLUDING INSULATING RESIN SHEET LAMINATE

TECHNICAL FIELD

The present invention relates to an insulating resin sheet with a film or a metal foil (hereinafter, in some cases, the insulating resin sheet with a film or a metal foil is referred to as an 'insulating resin sheet laminate') and a multi-layer printed circuit board using the insulating resin sheet with a film or a metal foil.

Priority is claimed on Japanese Patent Application No. 2007-006615, filed Jan. 16, 2007, the content of which is incorporated herein by reference.

Background Art

In recent years, electronic parts have been integrated and mounted in high density in response to demand for high-performance electronic apparatuses. Therefore, the size of multi-layer printed circuit boards used for high-performance electronic apparatuses has increased to correspond with high-density mounting. Therefore, it is necessary to reduce the size of multi-layer printed circuit boards and improve the degree of integration thereof. In general, a build-up multi-layer printed circuit board has been used in order to reduce the size of the multi-layer printed circuit board and to improve the degree of integration thereof (for example, see Patent Document 1).

The build-up multi-layer printed circuit board is generally manufactured by alternately laminating an insulating resin sheet with a film or a metal foil including an insulating resin layer and a conductor circuit layer. Therefore, when a multi-layer printed circuit board having a small size and a high degree of integration is manufactured, it is necessary to reduce the thickness of the insulating resin layer of the insulating resin sheet with a film or a metal foil. However, in a process of forming a thin insulating resin layer on a film or a metal foil, repulsion or unevenness occurs, which makes it difficult to obtain an insulating resin layer with a uniform thickness. As the degree of integration of the multi-layer printed circuit board is increased, a fine circuit wiring process is required. However, when the insulating resin layer having low thickness accuracy is used for a printed circuit board subjected to the fine circuit wiring process, the insulating reliability of the printed circuit board is lowered. Therefore, an insulating resin sheet with a film or with a metal foil is required which includes an insulating resin layer with a uniform thickness and which has high insulating reliability when the insulating resin layer is used for a printed circuit board (for example, see Patent Document 2).

[Patent Document 1] JP-A-7-106767
[Patent Document 2] JP-A-2005-101269

The present invention has been made in order to solve the above-mentioned problems. That is, an object of the present invention is to provide an insulating resin sheet with a film or a metal foil including an insulating resin layer with a uniform thickness that is formed without repulsion or unevenness in a process of forming the insulating resin layer on a film or a metal foil, and a multi-layer printed circuit board that includes the insulating resin sheet with a film or a metal foil and high insulating reliability.

Disclosure Of Invention

The above-mentioned object is achieved by the following structures (1) to (17) of the present invention.

(1) According to a first aspect of the present invention, an insulating resin sheet laminate includes: a film or a metal foil; and an insulating resin layer that is made of a resin composition and is formed on the film or the metal foil. The resin composition includes an acrylic surfactant.

(2) A second aspect of the present invention is, in the insulating resin sheet laminate according to (1) the first aspect, the acrylic surfactant may be at least one selected from a group consisting of butyl acrylate, butyl polyacrylate, a copolymer of butyl acrylate and 2-ethylhexyl acrylate, 2-ethylhexyl acrylate, and 2-ethylhexyl polyacrylate.

(3) A third aspect of the present invention is, in the insulating resin sheet laminate according to (1) the first aspect or (2) the second aspect, the acrylic surfactant may include 50 wt % or more of butyl acrylate.

(4) A fourth aspect of the present invention is, in the insulating resin sheet laminate according to any one of (1) the first aspect to (3) the third aspect, the content of the acrylic surfactant in the resin composition may be in the range of 0.1 to 10 wt %.

(5) A fifth aspect of the present invention is, in the insulating resin sheet laminate according to any one of (1) the first aspect to (4) the fourth aspect, the resin composition may include an epoxy resin.

(6) A sixth aspect of the present invention is, in the insulating resin sheet laminate according to (5) the fifth aspect, the epoxy resin may be an arylalkylene type epoxy resin.

(7) A seventh aspect of the present invention is, in the insulating resin sheet laminate according to any one of (1) the first aspect to (6) the sixth aspect, the insulating resin layer may include an inorganic filler.

(8) An eighth aspect of the present invention is, in the insulating resin sheet laminate according to (7) the seventh aspect, the inorganic filler may be spherical fused silica.

(9) A ninth aspect of the present invention is, in the insulating resin sheet laminate according to any one of (1) the first aspect to (8) the eighth aspect, the resin composition may include a phenolic hardener and/or an imidazole hardener.

(10) A tenth aspect of the present invention is, in the insulating resin sheet laminate according to any one of (1) the first aspect to (9) the ninth aspect, the insulating resin layer may include a phenoxy resin.

(11) An eleventh aspect of the present invention is, in the insulating resin sheet laminate according to any one of (1) the first aspect to (10) the tenth aspect, the insulating resin may include a cyanate resin and/or a prepolymer thereof.

(12) A twelfth aspect of the present invention is, in the insulating resin sheet laminate according to any one of (1) the first aspect to (11) the eleventh aspect, the film of the insulating resin sheet laminate may be a thermoplastic resin film having heat resistance.

(13) A thirteenth aspect of the present invention is, in the insulating resin sheet laminate according to any one of (1) the first aspect to (11) the eleventh aspect, the metal foil of the insulating resin sheet laminate may be a copper foil or an aluminum foil.

(14) A fourteenth aspect of the present invention is, in the insulating resin sheet laminate according to (1) the first aspect or (2) the second aspect, the metal foil of the insulating resin sheet laminate may be a two-layer metal foil having two layers that are laminated so as to be peeled off from each other and have different thicknesses, and the insulating resin layer may be formed on an ultrathin metal foil having a smaller thickness in the two-layer metal foil.

(15) A fifteenth aspect of the present invention is, in the insulating resin sheet laminate according to any one of (1) the first aspect to (14) the fourteenth aspect, the thickness of the insulating resin layer may be less than or equal to 50 μm.

(16) A sixteenth aspect of the present invention is, in the insulating resin sheet laminate according to any one of (1) the first aspect to (15) the fifteenth aspect, the insulating resin layer may include a base.

(17) A seventeenth aspect of the present invention is a multi-layer printed circuit board includes the insulating resin sheet laminate according to any one of (1) the first aspect to (16) the sixteenth aspect.

In the insulating resin sheet laminate (an insulating resin sheet with a film or a metal foil) according to the present invention, an insulating resin layer with a uniform thickness is formed without repulsion or unevenness in a process of coating a resin composition on a film or a metal foil. As a result, a multi-layer printed circuit board using the insulating resin sheet laminate can have high insulating reliability.

BEST MODE FOR CARRYING OUT THE INVENTION

Hereinafter, an insulating resin sheet with a film or a metal foil (an insulating resin sheet laminate) according to the present invention will be described.

In the insulating resin sheet with a film or a metal foil according to the present invention, an insulating resin layer is formed on a film or a metal foil.

Figure 1A:
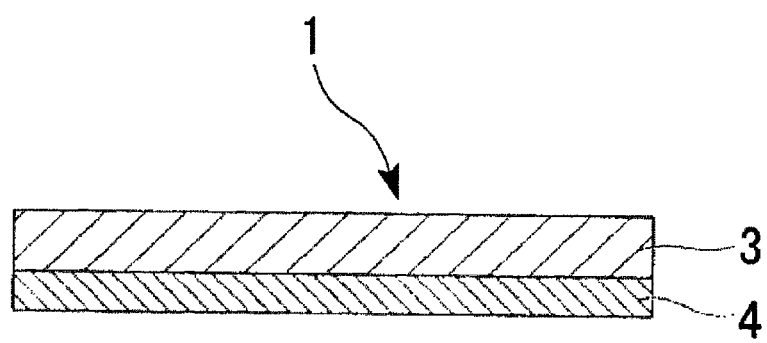
FIG. 1A is a cross-sectional view schematically illustrating an example of an insulating resin sheet with a film (insulating resin sheet laminate) according to the present invention.
Figure 1B:
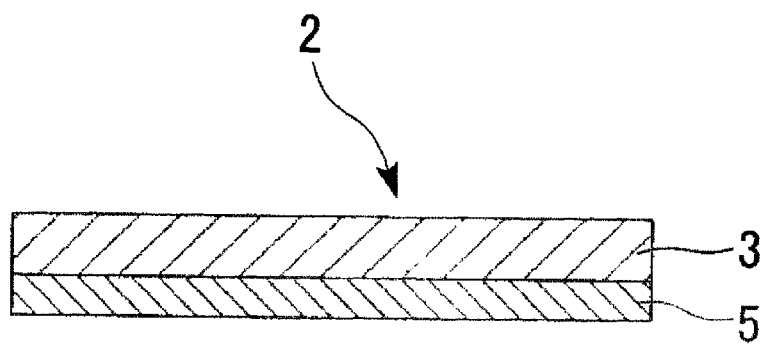
FIG. 1B is a cross-sectional view schematically illustrating an example of an insulating resin sheet with a metal foil (insulating resin sheet laminate) according to the present invention.

FIG. 1A is a cross-sectional view schematically illustrating an example of an insulating resin sheet with a film according to the invention, and FIG. 1B is a cross-sectional view schematically illustrating an example of an insulating resin sheet with a metal foil according to the present invention.

An insulating resin sheet 1 with a film or an insulating resin sheet 2 with a metal foil according to the present invention is formed by laminating an insulating resin layer 3 made of a resin composition on a film 4 or a metal foil 5. The insulating resin layer made of the resin composition is effective in filling a step portion of a circuit, planarizing the circuit after filling, and laser machining.

The reason for this is as follows. In the insulating resin sheet laminate according to the present invention, an insulating resin composition includes an acrylic surfactant. Therefore, it is possible to improve the dispersibility and wettability of a film or a metal foil when a resin composition is applied or coated onto a varnished film or metal foil, as well as adhesion between a resin composition layer and the film or the metal foil. As a result, a uniform interface between the insulating resin layer and the film or the metal foil is obtained. When the interface is uniform, in the subsequent photolithography process, light is focused on a desired point during exposure, and thus resolution is improved. When the resolution is improved, it is possible to manufacture a multi-layer printed circuit board having a fine wiring pattern.

In the insulating resin sheet with a film or a metal foil according to the present invention, the thickness of the insulating resin layer made of the resin composition is not particularly limited. However, it is preferable that the thickness of the insulating resin layer be less than or equal to 50 μm. It is more preferable that the thickness of the insulating resin layer be in the range of 5 to 40 μm. In this way, when the insulating resin sheet with a film or a metal foil is used to manufacture a multi-layer printed circuit board, it is possible to fill up any uneven portion of an inner layer circuit and ensure an appropriate insulating resin thickness. In addition, in the insulating resin sheet with a film or a metal foil, it is possible to prevent the insulating resin layer from being cracked and reduce the amount of powder generated during cutting.

The film or the metal foil used for the insulating resin sheet with a film or a metal foil according to the present invention is not particularly limited. For example, in the case of a film, a thermoplastic resin film having heat resistance, such as a polyester resin including, for example, polyethylene terephthalate or polybutylene terephthalate, a fluorine-based resin, or a polyimide resin is preferable. In the case of a metal foil, it is preferable that the metal foil be made of copper and/or copper alloy, aluminum and/or aluminum alloy, iron and/or iron alloy, silver and/or silver alloy, gold and gold alloy, zinc and zinc alloy, nickel and nickel alloy, or tin and tin alloy. It is more preferable that the metal foil be made of copper or aluminum. In this way, when the insulating resin sheet with a metal foil is laminated on an inner layer circuit board, a copper foil is etched, and the sheet is used as a conductor circuit, it is possible to obtain good electrical characteristics. In the aluminum foil, when the insulating resin layer is cured in, particularly, a high temperature range, the variation in thermal linear expansion coefficient is less than that in an insulating resin film. Therefore, stress occurring between the insulating resin layers is less than that in the resin film. As a result, it is possible to manufacture an insulating resin sheet with an aluminum foil in which the thickness of an insulating resin layer is uniform.

In addition, an ultrathin metal foil with a carrier foil may be used as the metal foil. The ultrathin metal foil with a carrier foil means a metal foil obtained by bonding a carrier foil that can be peeled off and an ultrathin metal foil such that they overlap each other. The ultrathin metal foil with a carrier foil can be used to form ultrathin metal foil layers on both surfaces of a laminated plate. Therefore, for example, when a circuit is formed by a semi-additive method, it is possible to directly form an ultrathin metal foil as a power supply layer using electrolytic plating (not electroless plating) to form a circuit, and perform flash etching on the ultrathin copper foil. When an ultrathin metal foil with a carrier foil has a thickness of 10 μm or less, it is possible to prevent the handling ability of the ultrathin metal foil from being lowered or the ultrathin copper foil from being cracked or broken in, for example, a pressing process. The thickness of the ultrathin metal foil is preferably greater than or equal to 0.1 μm and less than or equal to 10 μm, more preferably, greater than or equal to 0.5 μm and less than or equal to 5 μm, and most preferably, greater than or equal to 1 μm and less than or equal to 3 μm. If the thickness of the ultrathin metal foil is less than the lower limit of the above-mentioned range, the ultrathin metal foil is damaged after the carrier foil is peeled off, and pinholes are generated in the ultrathin metal foil. When the pinholes are generated, there is a concern that plating unevenness will occur, a circuit wiring line will be cut, and a chemical, such as an etchant or a desmear liquid, will flow into a circuit pattern during the formation of the circuit pattern. If the thickness is greater than the upper limit of the above-mentioned range, the thickness of the ultrathin metal foil varies greatly, which may cause a large variation in the surface roughness of the ultrathin metal foil.

In general, the carrier foil is peeled off from the ultrathin metal foil with a carrier foil before a circuit pattern is formed on a press-molded laminated plate.

The material forming the carrier foil of the ultrathin metal foil with a carrier foil is not particularly limited. For example, the ultrathin metal foil with a carrier foil may be made of copper and/or copper alloy, aluminum and/or aluminum alloy, iron and/or iron alloy, silver and/or silver alloy, gold and gold alloy, zinc and zinc alloy, nickel and nickel alloy, or tin and tin alloy. In addition, the ultrathin metal foil may be made of, for example, copper and/or copper alloy, aluminum and/or aluminum alloy, iron and/or iron alloy, silver and/or silver alloy, gold and gold alloy, zinc and zinc alloy, nickel and nickel alloy, or tin and tin alloy.

The material forming the ultrathin metal foil of the ultrathin metal foil with a carrier foil is not particularly limited. For example, the ultrathin metal foil may be made of copper and/or copper alloy, aluminum and/or aluminum alloy, iron and/or iron alloy, silver and/or silver alloy, gold and gold alloy, zinc and zinc alloy, nickel and nickel alloy, or tin and tin alloy. In addition, the ultrathin metal foil may be made of, for example, copper and/or copper alloy, aluminum and/or aluminum alloy, iron and/or iron alloy, silver and/or silver alloy, gold and gold alloy, zinc and zinc alloy, nickel and nickel alloy, or tin and tin alloy.

The thickness of the film or the metal foil is not particularly limited. However, it is preferable that the thickness be in the range of 10 to 100 µm in order to improve handling ability when the insulating resin sheet with a film or a metal foil is manufactured.

When the insulating resin sheet with a film or a metal foil according to the invention is manufactured, it is preferable that the roughness of one surface of the insulating resin layer bonded to the inner layer circuit board be very small and fine. In this way, it is possible to effectively obtain the effects of the present invention.

Next, a method of manufacturing the insulating resin sheet according to the present invention will be described.

The method of forming the insulating resin layer on a film or a metal foil is not particularly limited. For example, any of the following methods can be used: a method of dissolving and dispersing a resin composition including an acrylic surfactant in a solvent to produce a resin varnish, coating the resin varnish onto a base using various coaters, and drying the resin varnish; and a method of spraying the resin varnish onto a film or a metal foil using a sprayer and drying the resin varnish.

Of the methods, it is preferable to use the method of coating the resin varnish onto a film or a metal foil using various coaters, such as a comma coater and a die coater, and drying it. In this way, it is possible to effectively manufacture an insulating resin sheet with a film or a metal foil having a small void and an insulating resin layer with a uniform thickness.

Next, the resin composition used for manufacturing the insulating resin sheet with a film or a metal foil according to the present invention will be described.

The resin composition used for manufacturing the insulating resin sheet with a film or a metal foil according to the present invention is not particularly limited as long as it includes an acrylic surfactant. Examples of the acrylic surfactant include ethyl acrylate, butyl acrylate, isopropyl acrylate, 2-ethylhexyl acrylate, isobutyl acrylate, t-butyl acrylate, s-butyl acrylate, cyclohexyl acrylate, octadecyl acrylate, 2-ethoxyethyl acrylate, lauryl acrylate, stearyl acrylate, methyl methacrylate, ethyl methacrylate, isopropyl methacrylate, butyl methacrylate, s-butyl methacrylate, t-butyl methacrylate, cyclohexyl methacrylate, octadecyl methacrylate, 2-ethylhexyl methacrylate, lauryl methacrylate, and stearyl methacrylate. These materials may be individually used, or polymers thereof, a copolymer of two or more kinds of monomers, a mixture of two or more kinds of polymers, or a mixture of the copolymer and the polymer or the monomer may be used.

In this way, it is possible to improve an antifoaming property or a defoaming property and to control the wettability between the film or the metal foil and the insulating resin layer. Among the above-mentioned materials, it is preferable to use butyl acrylate, butyl polyacrylate, a copolymer of butyl acrylate and 2-ethylhexyl acrylate, 2-ethylhexyl acrylate, and 2-ethylhexyl polyacrylate as the acrylic surfactant. In addition, it is preferable that the content of butyl acrylate in the acrylic surfactant be greater than or equal to 50.0 wt %. The content of the acrylic surfactant in the resin composition is preferably in the range of 0.1 to 10.0 wt %, and more preferably, in the range of 0.3 to 5.0 wt %.

The reason why the content of the acrylic surfactant is set in the above-mentioned range is as follows. If the content of the acrylic surfactant is greater than the upper limit of the above-mentioned range, the acrylic surfactant is segregated on the surface of the coated film, which may cause poor insulation and defects in the adhesion of a conductor circuit. If the content is less than the lower limit of the above-mentioned range, defects, such as repulsion or unevenness, occur in the coated film. Therefore, it is difficult to form fine circuit wiring lines. As a result, there is a concern that productivity will be reduced. However, if the content is within the above-mentioned range, it is possible to rapidly remove fine air bubbles in the varnish. In addition, when an insulating resin is coated on a film or a metal foil, it is possible to form an insulating resin layer having a uniform thickness, without unevenness or repulsion.

The resin composition used for manufacturing the insulating resin sheet with a film or a metal foil is not particularly limited as long as it includes the acrylic surfactant. However, it is preferable that the resin composition include a thermosetting resin. In this way, it is possible to improve the heat resistance of the insulating resin layer.

In this case, a known thermosetting resin may be used as the thermosetting resin. For example, an epoxy resin, a cyanate ester resin, a thermosetting polyimide resin, a thermosetting polyphenylene ether resin, a phenolic resin, and combinations of one or two or more kinds of resins may be used, but the present invention is not limited thereto. Among the resins, it is preferable to use an epoxy resin having high heat resistance, high chemical resistance, and high compatibility with processing. In addition, a cyanate ester resin may also be used in order to increase heat resistance and rigidity.

It is preferable that the resin composition include an epoxy resin. The epoxy resin is not particularly limited. However, for example, any of the following epoxy resins may be used: a bisphenol type epoxy resin, such as a bisphenol A type epoxy resin, a bisphenol F type epoxy resin, a bisphenol S type epoxy resin, a bisphenol Z type (4,4'-cyclohexylidene bisphenol type) epoxy resin, a bisphenol P type (4,4'-(1,4)-phenylenediisopropylidene) bisphenol type) epoxy resin, or a bisphenol M type (4,4'-(1,3-phenylenediisopropylidene) bisphenol type) epoxy resin; a novolac type epoxy resin, such as a phenol novolac type epoxy resin or a cresol novolac epoxy resin; a biphenyl type epoxy resin; a biphenyl aralkyl type epoxy resin; an aryl alkylene type epoxy resin; a naphthalene type epoxy resin; an anthracene type epoxy resin; a phenoxy type epoxy resin; a dicyclopentadiene type epoxy resin; a norbornene type epoxy resin; an adamantane type epoxy resin; and a fluorene type epoxy resin. Among these epoxy resins, one kind of resin may be used independently, two or more kinds of epoxy resins having different weight-average molecular weights may be used, or one or more kinds of epoxy resins and prepolymers thereof may be used.

Particularly, it is preferable to use the aryl alkylene type epoxy resin among these epoxy resins. In this way, it is possible to improve solder heat resistance after moisture absorption and flame resistance.

The aryl alkylene type epoxy resin means an epoxy resin having one or more aryl alkylene groups in a constitutional repeating unit. Examples of the aryl alkylene type epoxy resin include a xylylene type epoxy resin and a biphenyl dimethylene type epoxy resin. Among them, the biphenyl dimethylene type epoxy resin is preferable. The biphenyl dimethylene type epoxy resin may be represented by Chemical formula (I) given below:

$2.0 \times 10^4$ and more particularly, in the range of $8.0 \times 10^2$ to $1.5 \times 10^4$. If the weight-average molecular weight is less than the lower limit of the above-mentioned range, tackiness is likely to occur in the surface of the insulating resin layer. On the other hand, if the weight-average molecular weight is greater than the upper limit of the above-mentioned range, the solder heat resistance is likely to be lowered. The weight-average molecular weight in the above-mentioned range makes it possible to obtain well-balanced characteristics.

It is preferable that the resin composition include an inorganic filler. The inorganic filler is not particularly limited. However, examples of the inorganic filler include silicates, such as talc, calcined clay, non-calcined clay and, mica, and glass, oxides, such as titanium oxide, alumina, silica, and fused silica, carbonates, such as calcium carbonate, magnesium carbonate, and hydrotalcite, hydroxides, such as aluminum hydroxide, magnesium hydroxide, and calcium hydroxide, sulfates or sulfites, such as barium sulfate, calcium sulfate, and calcium sulfite, borates, such as zinc borate, barium metaborate, aluminum borate, calcium borate, and sodium borate, nitrides, such as aluminum nitride, boron nitride, silicon nitride, and carbon nitride, and titanates, such as strontium titanate and barium titanate. Among them, one

[Chemical formula I]

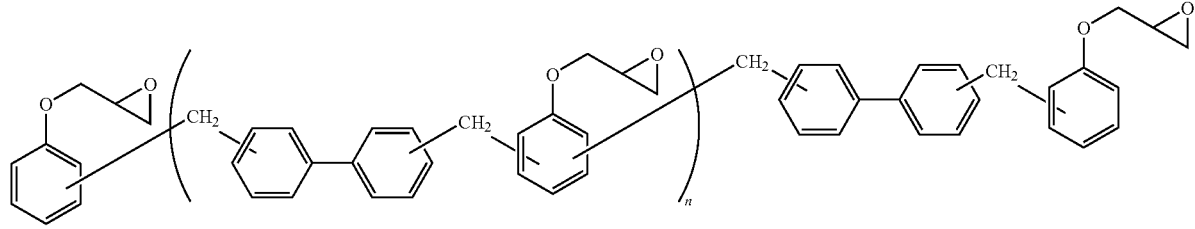

(where n is an arbitrary integer).

The average repeating unit n of the biphenyl dimethylene type epoxy resin represented by the above-described Chemical formula (I) is not particularly limited, but is preferably in the range of 1 to 10, and more preferably in the range of 2 to 5. If the average repeating unit n is less than the lower limit of the above-mentioned range, the biphenyl dimethylene type epoxy resin is likely to be crystallized, and solubility for a general-purpose solvent is relatively reduced. In this case, it is difficult to treat the biphenyl dimethylene type epoxy resin. On the other hand, if the average repeating unit n is greater than the upper limit of the above-mentioned range, the flowability of the resin is lowered, which may cause a molding defect. Therefore, the average repeating unit n of the biphenyl dimethylene type epoxy resin in the above-mentioned range makes it possible to obtain well-balanced characteristics.

The content of the epoxy resin is not particularly limited, but is preferably in the range of 1 to 55 wt % of the resin composition, and more particularly, in the range of 5 to 40 wt % of the resin composition. If the content is less than the lower limit of the above-mentioned range, the humidity resistance of the resin composition is likely to be lowered. On the other hand, if the content is greater than the upper limit of the above-mentioned range, the low-thermal expansion property and the heat resistance of the resin composition are likely to be lowered.

The weight-average molecular weight of the epoxy resin is not particularly limited. However, the weight-average molecular weight is preferably in the range of $5.0 \times 10^2$ to kind of material may be used independently, or two or more kinds of materials may be used. Among the above-mentioned materials, silica is preferable. In particular, fused silica (particularly, spherical fused silica) is preferable in terms of a low-thermal expansion property. The shape of the fused silica includes a crushed shape and a spherical shape. The usage of the fused silica depends on its purpose. For example, the spherical silica is used to reduce the melt viscosity of the resin composition in order to ensure flowability to a fabric base.

The average particle diameter of the inorganic filler is not particularly limited. However, the average particle diameter is preferably in the range of 0.01 to 5.0 μm, and more preferably, in the range of 0.1 to 2.0 μm. If the average particle diameter of the inorganic filler is less than the lower limit of the above-mentioned range, the viscosity of the resin composition is increased, which may have an adverse effect on workability when the insulating resin sheet with a film or a metal foil is manufactured. If the average particle diameter of the inorganic filler is greater than the upper limit of the above-mentioned range, for example, the inorganic filler is likely to be precipitated in the resin varnish. The average particle diameter of the inorganic filler in the above-mentioned range makes it possible to obtain well-balanced characteristics.

The inorganic filler is not particularly limited. However, an inorganic filler having a monodispersed average particle diameter or an inorganic filler having a polydispersed average particle diameter may be used. In addition, one or more kinds of inorganic fillers having monodispersed and/or polydispersed average particle diameters may be used.

The content of the inorganic filler is not particularly limited. However, the content of the inorganic filler is preferably in the range of 20 to 80 wt % of the resin composition, and more preferably, in the range of 30 to 70 wt % of the resin composition.

If the content of the inorganic filler is less than the lower limit of the above-mentioned range, the effect of providing low thermal expansion and low water absorption is likely to be lowered. On the other hand, if the content of the inorganic filler is greater than the upper limit of the above-mentioned range, the flowability of the resin composition is lowered, and the formability of the insulating resin layer is lowered. The content of the inorganic filler in the above-mentioned range makes it possible to obtain well-balanced characteristics.

It is preferable that the resin composition include a phenolic hardener and/or an imidazole hardener. The phenolic hardener is not particularly limited. For example, as the phenolic hardener, any of the following phenolic resins may be used: a novolac type phenolic resin, such as a phenol novolac resin, a cresol novolac resin, or a bisphenol A novolac resin; and a resol type phenolic resin, such as a native resol phenolic resin or an oil-modified resol phenolic resin modified from wood oil, linseed oil, or walnut oil. In this way, it is possible to improve adhesion with a film or a metal foil and the heat resistance of the insulating resin layer. In addition, it is possible to obtain high performance, such as a reduction in the moisture absorption of the insulating resin layer.

In this case, the amount of phenolic hardener added is in the range of 1 to 25 wt % of the resin composition, preferably, in the range of 5 to 15 wt % of the resin composition. A small amount of imidazole hardener is sufficient for curing. Therefore, the amount of imidazole hardener added is in the range of 0.01 to 5 wt % of the resin composition, preferably, in the range of 0.1 to 1.0 wt % of the resin composition.

The reason the additive amount of phenolic hardener or imidazole hardener is set in the above-mentioned range is as follows. If the additive amount is greater than the upper limit of the above-mentioned range, shelf life deteriorates and viscosity is increased. As a result, it is difficult to bury a circuit, or productivity is likely to be unstable. On the other hand, if the additive amount is less than the lower limit of the above-mentioned range, sufficient curing is not performed. As a result, there is a concern that mechanical strength or insulating reliability will be lowered.

It is preferable that the imidazole hardener be used when the resin composition includes, particularly, an epoxy resin. The imidazole hardener is not particularly limited. However, for example, as the imidazole hardener, any of the following materials may be used: 2-phenyl-4-methylimidazole; 2-phenyl-4-methyl-5-hydroxymethylimidazole; 2-phenyl-4,5-dihydroxymethylimidazole; 2,4-diamino-6-[2'-methylimidazolyl-(1')]-ethyl-s-triazine; 2,4-diamino-6-(2'-undecylimidazolyl)-ethyl-s-triazine; and 2,4-diamino-6-[2'-ethyl-4-methylimidazolyl-(1')]-ethyl-s-triazine. Among them, it is preferable to use an imidazole compound having two or more functional groups selected from an aliphatic hydrocarbon group, an aromatic hydrocarbon group, a hydroxyalkyl group, and a cyanoalkyl group. In particular, 2-phenyl-4,5-dihydroxymethylimidazole is preferable. In this way, it is possible to improve the heat resistance of an insulating resin layer, and the solder heat resistance of a multi-layer printed circuit board having a small thermal expansion coefficient and a small water absorption coefficient after humidity absorption.

It is preferable that the resin composition include a phenoxy resin. The phenoxy resin is not particularly limited. However, for example, any of the following materials may be used: phenoxy resins having a bisphenol A skeleton, a bisphenol F skeleton, a bisphenol S skeleton, and a bisphenol M skeleton (4,4'-(1,3-phenylenediisopropylidene) bisphenol skeleton); a phenoxy resin having a bisphenol P skeleton (4,4'-(1,4)-phenylenediiso-propylidene) bisphenol skeleton); a phenoxy resin having a bisphenol Z skeleton (4,4'-cyclohexydienebisphenol skeleton); a phenoxy resin having a novolac skeleton; a phenoxy resin having an anthracene skeleton; a phenoxy resin having a fluorene skeleton; a phenoxy resin having a dicyclopentadiene skeleton; a phenoxy resin having a norbornene skeleton; a phenoxy resin having a naphthalene skeleton; a phenoxy resin having a biphenyl skeleton; and a phenoxy resin having an adamantane skeleton. A structure having a plurality of kinds of skeletons among the above-mentioned skeletons may be used, or a phenoxy resin having skeletons at different ratios may be used. In addition, a plurality of kinds of phenoxy resins having different skeletons may be used, a plurality of kinds of phenoxy resins having different weight-average molecular weights may be used, or prepolymers thereof may be used.

Among the phenoxy resins, it is preferable to use phenoxy resins having a biphenyl skeleton and a bisphenol S skeleton. In this way, it is possible to increase the glass transition temperature using the inflexibility of the biphenyl skeleton, and improve the adhesion of a plating metal when a multi-layer printed circuit board is manufactured, using the bisphenol S skeleton.

It is preferable to use phenoxy resins having a bisphenol A skeleton and a bisphenol F skeleton. In this way, it is possible to improve the adhesion between an inner layer circuit board and an insulating resin layer when a multi-layer printed circuit board is manufactured.

The molecular weight of the phenoxy resin is not particularly limited. However, the weight-average molecular weight is preferably in the range of $5.0 \times 10^3$ to $7.0 \times 10^4$, and more preferably, in the range of $1.0 \times 10^4$ to $6.0 \times 10^4$.

If the weight-average molecular weight of the phenoxy resin is less than the lower limit of the above-mentioned range, an effect of improving a film forming property is likely to be insufficient. On the other hand, if the weight-average molecular weight of the phenoxy resin is greater than the upper limit of the above-mentioned range, the solubility of the phenoxy resin is likely to be lowered. The weight-average molecular weight of the phenoxy resin in the above-mentioned range makes it possible to obtain well-balanced characteristics.

The content of the phenoxy resin is not particularly limited. However, the content of the phenoxy resin is preferably less than or equal to 30 wt % of the resin composition, and more preferably, in the range of 1 to 20 wt % of the resin composition.

If the content of the phenoxy resin is less than the lower limit of the above-mentioned range, the effect of improving a film forming property is likely to be insufficient. On the other hand, if the content of the phenoxy resin is greater than the upper limit of the above-mentioned range, the relative content of cyanate resin is reduced. In this case, the effect of providing low-thermal expansion is likely to be lowered. The content of the phenoxy resin in the above-mentioned range makes it possible to obtain well-balanced characteristics.

It is preferable that the resin composition include a cyanate resin and/or a prepolymer thereof. The cyanate resin and/or the prepolymer thereof are not particularly limited. For example, any of the following materials may be used: a novolac type cyanate resin; a bisphenol type cyanate resin, such as a bisphenol A type cyanate resin, a bisphenol E type cyanate resin, or a tetramethylbisphenol F type cyanate resin;

or prepolymers thereof. Among them, a novolac type cyanate resin and/or a prepolymer thereof is preferable. In this way, it is possible to reduce the linear thermal expansion coefficient of the insulating resin layer and increase crosslink density to improve heat resistance. In addition, it is possible to improve the flame resistance of the resin composition. Further, it is possible to improve the electrical characteristics (a small dielectric constant and a small dielectric tangent) and mechanical strength of the insulating resin layer.

For example, a novolac type cyanate resin represented by the following Chemical formula (II) may be used.

[Chemical formula II]

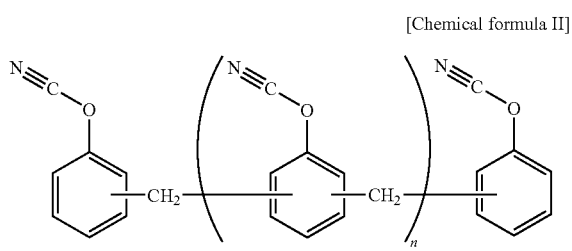

(where n is an arbitrary integer).

The average repeating unit n of the novolac type cyanate resin represented by the above-described Chemical formula (II) is not particularly limited, but is preferably in the range of 1 to 10, and more preferably, in the range of 2 to 7. If the average repeating unit n is less than the lower limit of the above-mentioned range, the novolac type cyanate resin is likely to be crystallized, and solubility for a general-purpose solvent relatively reduced. In this case, it is difficult to treat the novolac type cyanate resin. On the other hand, if the average repeating unit n is greater than the upper limit of the above-mentioned range, melt viscosity is excessively high. As a result, the formability of an insulating resin layer is likely to be lowered.

The weight-average molecular weight of the cyanate resin is not particularly limited. However, the weight-average molecular weight is preferably in the range of $5.0 \times 10^2$ to $4.5 \times 10^3$, and more preferably, in the range of $6.0 \times 10^2$ to $3.0 \times 10^3$. If the weight-average molecular weight is less than the lower limit of the above-mentioned range, the mechanical strength of the hardened insulating resin layer is likely to be lowered, and tackiness is likely to occur when an insulating resin layer is formed on a film or a metal foil, which may cause the transfer of a resin. If the weight-average molecular weight is greater than the upper limit of the above-mentioned range, a hardening reaction rapidly occurs. In the case of multi-layer printed wiring, a formation defect is likely to occur, or interlayer peeling strength is likely to be lowered. For example, the weight-average molecular weight of the cyanate resin can be measured by GPC.

In addition, one kind of cyanate resin or a derivative thereof may be used independently, two or more kinds of cyanate resins having different weight-average molecular weights may be used, or one or more kinds of cyanate resins and prepolymers thereof may be used. However, the invention is not limited thereto.

The amount of cyanate resin added is in the range of 5 to 40 wt % of the resin composition, preferably, in the range of 10 to 30 wt % of the resin composition.

The reason the amount of cyanate resin added is in the above-mentioned range is as follows. If the additive amount is greater than the upper limit of the above-mentioned range, there is a concern that the mechanical strength or the humidity resistance of the obtained product will be lowered. On the other hand, if the additive amount is less than the lower limit of the above-mentioned range, there is a concern that the adhesion between an insulating resin layer and a conductor circuit will be lowered, or rigidity or heat resistance will be lowered.

It is preferable that the resin composition further include a coupling agent. The coupling agent is not particularly limited. However, for example, it is preferable to use one or more kinds of coupling agents selected from an epoxysilane coupling agent, a cationic silane coupling agent, an aminosilane coupling agent, a titanate-based coupling agent, and a silicone oil type coupling agent. In this way, it is possible to improve the adhesion between an insulating resin layer and a film or a metal foil. When the resin composition includes a resin, such as an epoxy resin, and an inorganic filler, it is possible to improve the wettability of an interface between the resin and the inorganic filler. Therefore, it is possible to further improve heat resistance.

The content of the coupling agent is not particularly limited. However, it is preferable that the content of the coupling agent be in the range of 0.05 to 3.00 wt % of the resin composition.

If the content of the coupling agent is less than the lower limit of the above-mentioned range, the effect of improving the adhesion between the insulating resin layer and the film or the metal foil is likely to be reduced. When the resin composition includes a resin, such as an epoxy resin, and an inorganic filler, the effect of improving the wettability between the resin and the inorganic filler is likely to be reduced. On the other hand, if the content of the coupling agent is greater than the upper limit of the above-mentioned range, the bending strength of the insulating resin layer is likely to be lowered. The content of the coupling agent in the above-mentioned range makes it possible to obtain well-balanced characteristics.

The resin composition may further include a hardening accelerator, if necessary. A known material may be used as the hardening accelerator. For example, any of the following materials may be used: an organic metal salt, such as zinc naphthenate, cobalt naphthenate, tin octoate, cobalt octoate, cobalt bis-acetylacetonate (II), or cobalt trisacetylacetonate (III); tertiary amine, such as triethylamine, tributylamine, or diazabicyclo [2,2,2] octane; a phenol compound, such as phenol, bisphenol A, or nonyl phenol; an organic acid, such as acetic acid, benzoic acid, salicylic acid, or p-toluene sulfonic acid; and mixtures thereof. Among them, one kind of material or a derivative thereof may be used independently, or two or more kinds of materials or derivatives thereof may be used.

The insulating resin layer of the insulating resin sheet with a film or a metal foil according to the present invention may be made of a thermoplastic resin, such as a polyimide resin, a polyamide imide resin, a polyphenylene oxide resin, a polyether sulfone resin, a polyester resin, a polyethylene resin, or a polystyrene resin, a polystyrene-based thermoplastic elastomer, such as a styrene-butadiene copolymer or a styrene-isoprene copolymer, a thermoplastic elastomer, such as a polyolefin-based thermoplastic elastomer, a polyamide-based elastomer, or a polyester-based elastomer, or a diene-based elastomer, such as polybutadiene, epoxy-modified polybutadiene, acrylic-modified polybutadiene, or methacryl-modified polybutadiene.

In addition, additives, such as pigment, paint, an antifoaming agent, a leveling agent, an ultraviolet absorbing agent, a foaming agent, an antioxidant, a flame retardant, and an ion scavenger, other than the above-mentioned components may be added to the resin composition, if necessary.

Next, a solvent used for the resin varnish will be described.

It is preferable that the solvent used for the resin varnish have good solubility for a resin component in a resin material. A poor solvent may also be used as long as it does not have an adverse effect on the resin varnish. Examples of a solvent having high solubility include acetone, methylethylketone, methylisobutyl ketone, cyclohexanone, tetrahydrofuran, dimethylformamide, dimethylacetamide, and dimethylsulfoxide.

The content of a solid body in the resin varnish is not particularly limited. However, the content of the solid body in the resin varnish is preferably in the range of 30 to 80 wt %, and more preferably, in the range of 40 to 70 wt %.

It is preferable that the insulating resin sheet with a film or a metal foil according to the present invention be a prepreg having a base on an insulating resin layer. In this way, it is possible to improve the dimension stability of a multi-layer printed circuit board.

Next, the prepreg will be described.

The prepreg according to the invention is formed by impregnating the insulating resin composition into a fiber base. In this way, it is possible to obtain a prepreg applicable to the manufacture of a printed circuit board having high characteristics, such as high dielectric characteristics and high mechanical and electrical connection reliability in a high temperature and humidity environment.

Examples of the fiber base include a glass fiber base, such as glass fabric or glass nonwoven, a synthetic fiber base made of woven or nonwoven having, as a main ingredient, a polyamide-based resin fiber, such as a polyamide resin fiber, an aromatic polyamide resin fiber, or a wholly aromatic polyamide resin fiber, a polyester-based resin fiber, such as a polyester resin fiber, an aromatic polyester resin fiber, or a wholly aromatic polyester resin fiber, a polyimide resin fiber, or a fluororesin fiber, and an organic fiber base, such as a paper base having, as a main ingredient, craft paper, cotton linter paper, or mixed paper of linter and craft pulp. Among them, the glass fiber base is preferable. In this way, it is possible to improve the strength of prepreg and obtain a low water-absorption prepreg. In addition, it is possible to reduce the linear expansion coefficient of the prepreg.

As the method of impregnating the insulating resin composition according to the present invention into a fiber base, for example, any of the following methods can be used: a method of dispersing the insulating resin composition according to the present invention in an organic solvent to produce a resin varnish and immersing the fiber base in the resin varnish; a method of coating the insulating resin composition using various coaters; and a method of spraying the insulating resin composition using a sprayer. Among the above-mentioned methods, the method of immersing the fiber base in the resin varnish is preferable. In this way, it is possible to improve the impregnation of the insulating resin composition into the fiber base. In addition, a general impregnating and coating apparatus may be used to impregnate the fiber base into the resin varnish.

It is preferable that the solvent used for the resin varnish have high solubility for a resin component in the insulating resin composition. A poor solvent may also be used as long as it has no adverse effect on the insulating resin composition. Examples of the solvent having high solubility include acetone, methylethylketone, methylisobutyl ketone, cyclohexanone, tetrahydrofuran, dimethylformamide, dimethylacetamide, dimethylsulfoxide, ethylene glycol, a cellosolve-based solvent, and a carbitol-based solvent.

The concentration of a non-volatile component in the resin varnish is not particularly limited. However, the concentration is preferably in the range of 40 to 80 wt % and more preferably, in the range of 50 to 65 wt %. In this way, it is possible to maintain the viscosity of the resin varnish at an appropriate level, and further improve the impregnation of the resin varnish into the fiber base. It is possible to obtain a prepreg by impregnating the insulating resin composition into the fiber base and drying it at a predetermined temperature, for example, at a temperature of 80 to 200° C.

The prepreg is laminated so as to overlap the film or the metal foil at a temperature of 50 to 150° C. and a pressure of 0.1 to 5 MPa. In this way, it is possible to obtain an insulating resin sheet laminate formed on a film or a metal foil.

Next, a multi-layer printed circuit board using the insulating resin sheet with a film or a metal foil according to the present invention will be described.

The multi-layer printed circuit board is obtained by forming the insulating resin sheet with a film or a metal foil on an inner layer circuit pattern forming surface of the inner layer circuit board such that they overlap each other using hot pressing.

Next, a method of manufacturing the multi-layer printed circuit board will be described.

Figure 2:
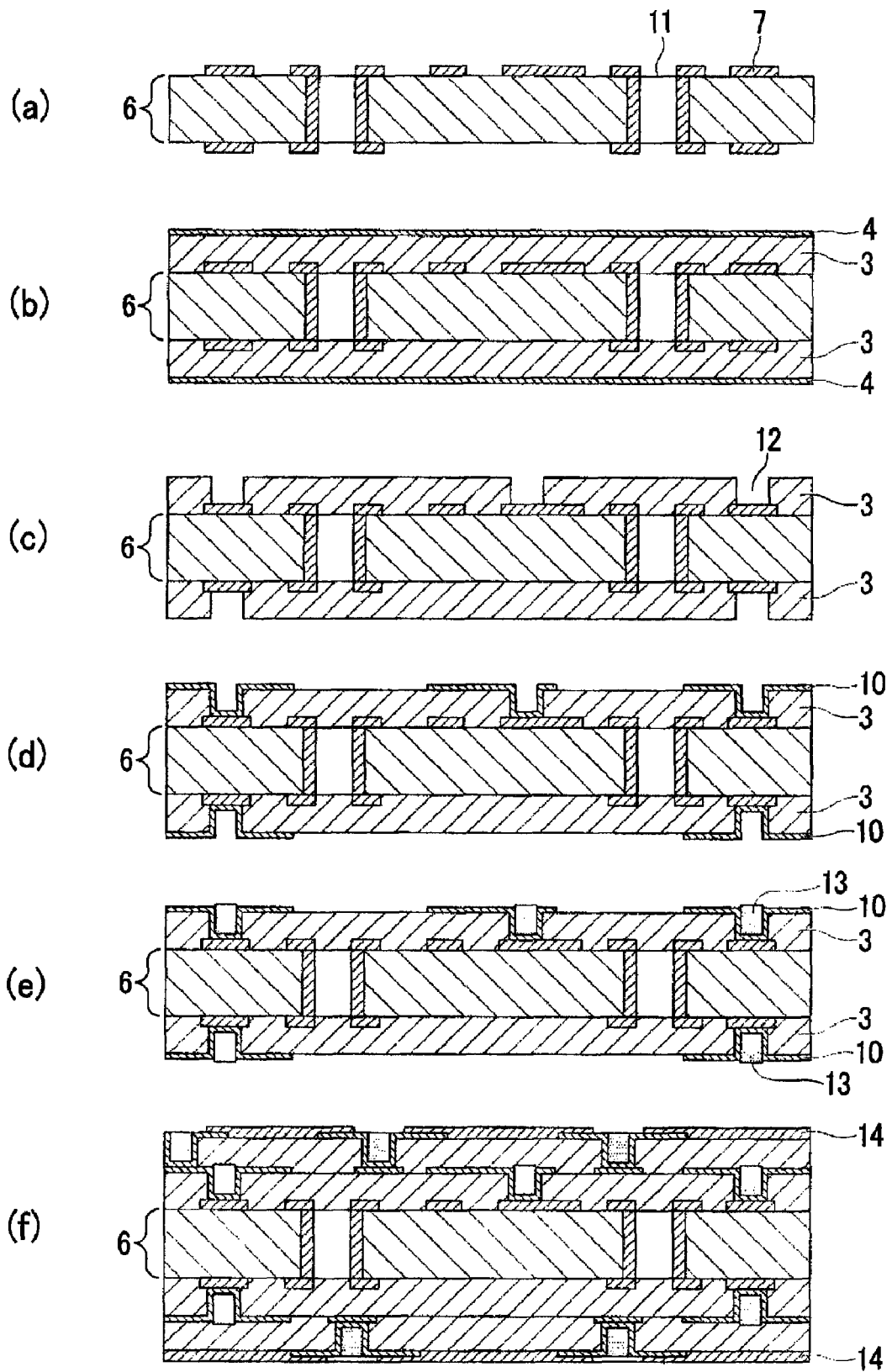
FIG. 2 is a cross-sectional view illustrating an example of a method of manufacturing a multi-layer printed circuit board using the insulating resin sheet with a film (insulating resin sheet laminate) according to the present invention.

FIG. 2 shows an example of a method of manufacturing a multi-layer printed circuit board using an insulating resin sheet with a film. FIG. 2(a) shows an inner layer circuit board 6 obtained by forming a circuit pattern on a core substrate (for example, an FR-4 double-sided copper foil). An opening 11 is formed in the inner layer circuit board by a drilling machine, and electroless plating is performed on the opening 11 to electrically connect both surfaces of the inner layer circuit board 6. Then, the copper foil is etched to form an inner layer circuit 7.

For example, a circuit board obtained by performing a roughening process, such as a blackening process, on an inner layer circuit portion may be used as the inner layer circuit board used to manufacture the multi-layer printed circuit board. In addition, the opening 11 may be filled with a conductor paste or a resin paste.

The inner layer circuit 7 may be made of any material as long as the material is suitable for the manufacturing method. However, it is preferable that the inner layer circuit be made of a material that can be removed by etching or peeling during the formation of the inner layer circuit and has chemical resistance to chemicals used for etching. Examples of the material forming the inner layer circuit 7 include a copper foil, a copper plate, a copper alloy plate, an alloy, and nickel. In particular, the copper foil, the copper plate, and the copper alloy plate are most preferable as the material forming the inner layer circuit 7. The reason is that it is possible to select products obtained by electrolytic plating or rolled products and it is easy to acquire a copper foil, a copper plate, or a copper alloy plate having various thicknesses.

Then, the insulating resin sheet with a film is laminated so as to cover the inner layer circuit 7 (FIG. 2(b)). The method of laminating the insulating resin sheet with a film is not particularly limited. However, methods of laminating the insulating resin sheet with a film using a vacuum press, an atmospheric pressure laminator, and a vacuum hot press laminator are preferable. Among them, the method of laminating the insulating resin sheet with a film using the vacuum hot press laminator is more preferable.

Then, the formed insulating resin layer 3 is cured by heat. The curing temperature is not particularly limited. However, the curing temperature is preferably in the range of 100° C. to 250° C., and more preferably, in the range of 150° C. to 200°

C. In addition, it is preferable that the insulating resin layer be partially cured in order to make it easy to radiate laser beams and remove resin residues in the subsequent processes. In this case, the partial curing temperature is preferably in the range of 80° C. to 200° C., and more preferably, in the range of 100° C. to 180° C. However, it is necessary to peel off a film 4 before a laser beam is radiated to form an opening 12 in the insulating resin layer in the subsequent process. The film 4 may be peeled off after the insulating resin layer is formed, or before or after the insulating resin layer is cured by heat.

A laser beam is radiated to the insulating resin layer 3 to form the opening 12 (FIG. 2(*c*)). For example, an excimer laser, a UV laser, or a carbon dioxide laser may be used as the laser. The use of the laser makes it possible to easily form a minute opening 12 regardless of whether the material forming the insulating resin layer 3 is photosensitive or non-photosensitive. Therefore, laser machining is particularly preferable when it is necessary to form a minute opening in the insulating resin layer 3.

It is preferable to remove the resin residues after the laser radiation with an oxidizer, such as permanganate or bichromate. In addition, it is possible to simultaneously roughen the flat surface of the insulating resin layer 3 and improve the adhesion of a conductor wiring circuit formed by metal plating. Minute uneven portions can be uniformly formed on a resin layer formed from the resin composition according to the present invention by the roughening process. Since the flatness of the surface of the resin layer is high, it is possible to accurately form a minute wiring circuit.

Then, an outer layer circuit 10 is formed (FIG. 2(*d*)). The outer layer circuit 10 may be formed by, for example, a semi-additive method, which is a known method. However, the present invention is not limited thereto. Then, a conductor post is formed (FIG. 2(*e*)). A conductor post 13 may be formed by, for example, an electrolytic plating method, which is a known method. For example, copper electrolytic plating may be performed using the outer layer circuit 10 as an electrolytic plating lead to fill the opening with copper, thereby forming the copper post. In this stage, the processes shown in FIGS. 2(*b*) to 2(*e*) may be repeatedly performed to form multiple layers. However, when the insulating resin layer is partially cured, post-curing may be performed.

Then, a solder resist 14 is formed (FIG. 2(*f*)). The method of forming the solder resist 14 is not particularly limited. However, for example, the solder resist may be formed by a method of laminating a dry-film-type solder resist and performing exposure and development on the solder resist, or a method of printing a liquid resist and performing exposure and development on the liquid resist. In addition, a connecting electrode portion may be covered with a metal film formed by nickel plating, gold plating, and solder plating. It is possible to manufacture a multi-layer printed circuit board using the above-mentioned method.

Figure 3:
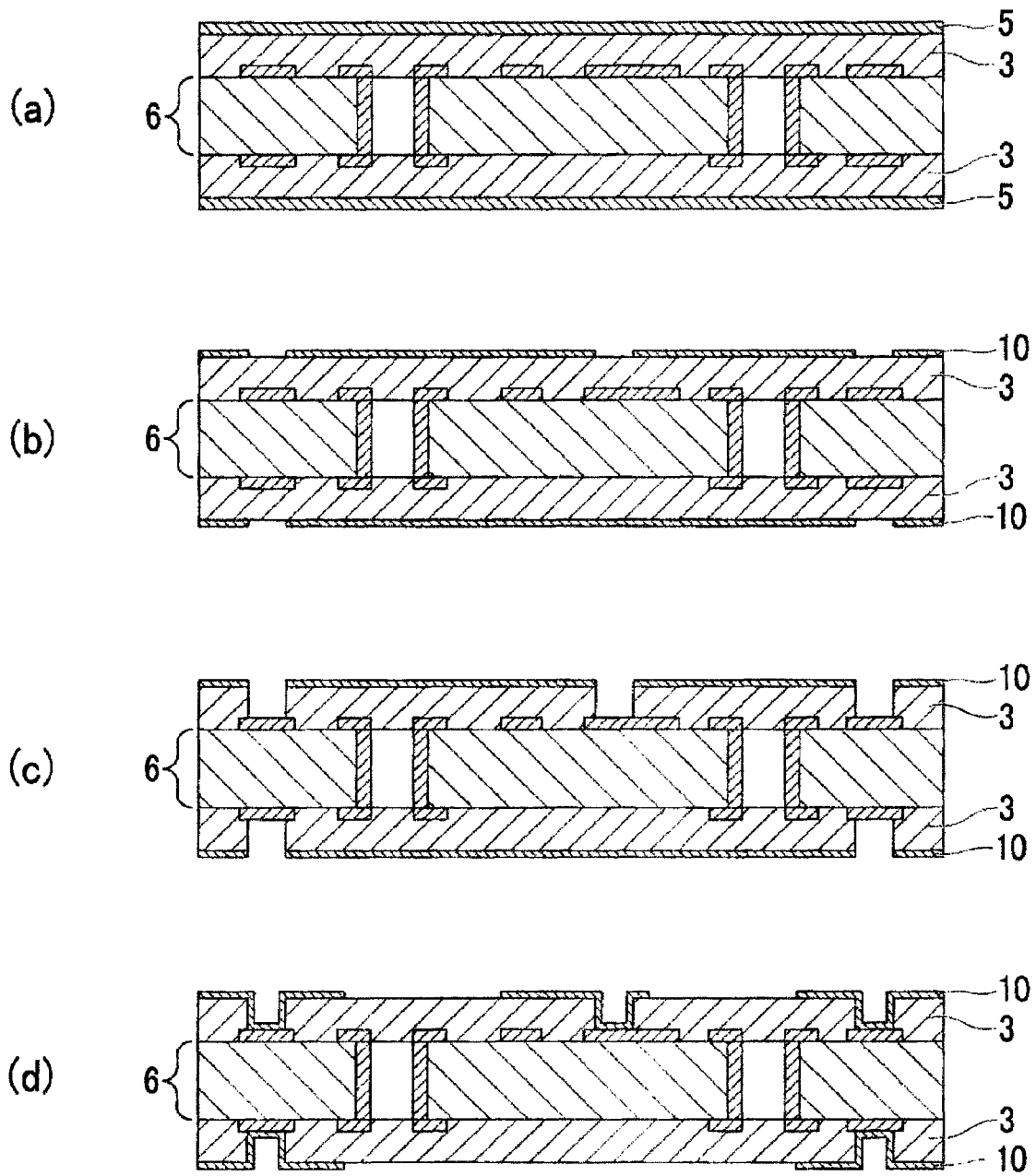
FIG. 3 is a cross-sectional view illustrating an example of a method of manufacturing a multi-layer printed circuit board using the insulating resin sheet with a metal foil (insulating resin sheet laminate) according to the present invention.

FIG. 3 shows an example of a method of manufacturing a multi-layer printed circuit board using an insulating resin sheet with a metal foil. The insulating resin sheet with a metal foil is laminated so as to cover the inner layer circuit 7 of the inner layer circuit board 6 shown in FIG. 2(*a*) (FIG. 3(*a*)). The method of laminating the insulating resin sheet with a metal foil is not particularly limited, similar to the method of laminating the insulating resin sheet with a film. However, methods of laminating the insulating resin sheet with a metal foil using a vacuum press, an atmospheric pressure laminator, and a vacuum hot press laminator are preferable. Among them, the method of laminating the insulating resin sheet with a metal foil using the vacuum hot press laminator is more preferable.

Then, in order to form a via in a copper foil 5 with a laser, a via forming position on the copper foil 5 is etched (FIG. 3(*b*)), and a laser beam is radiated to the etched portion to form the via (FIG. 3(*c*)). Resin residues after laser radiation are removed by an oxidizer, such as permanganate or bichromate. Then, metal plating is performed to connect the insulating resin layers and etching is performed to form an outer layer circuit pattern (FIG. 3(*d*)). Then, the same process as that using the insulating resin sheet with a film can be performed to obtain a multi-layer printed circuit board. When an insulating resin sheet with a thick copper foil is used, it is difficult to obtain a fine pitch in the subsequent process of manufacturing a circuit pattern. Therefore, an ultrathin copper foil with a thickness of 1 to 5 μm may be used, or a copper foil with a thickness of 12 to 18 μm may be half-etched into an ultrathin copper foil with a thickness of 1 to 5 μm. In addition, holes may be directly formed in the insulating resin layer and the copper foil. In this case, it is preferable that the copper foil is thin, and half etching or an ultrathin copper foil is used.

When the entire surface of the copper foil is etched using the transfer of minute uneven portions on the surface of the copper foil to the surface of the insulating resin layer, it is possible to manufacture a multi-layer printed circuit board by the same method as that using the insulating resin sheet with a film. In this way, the minute uneven portions formed in the insulating resin layer can improve the adhesion between a circuit and the insulating resin layer.

Next, a semiconductor device will be described.

Figure 4:
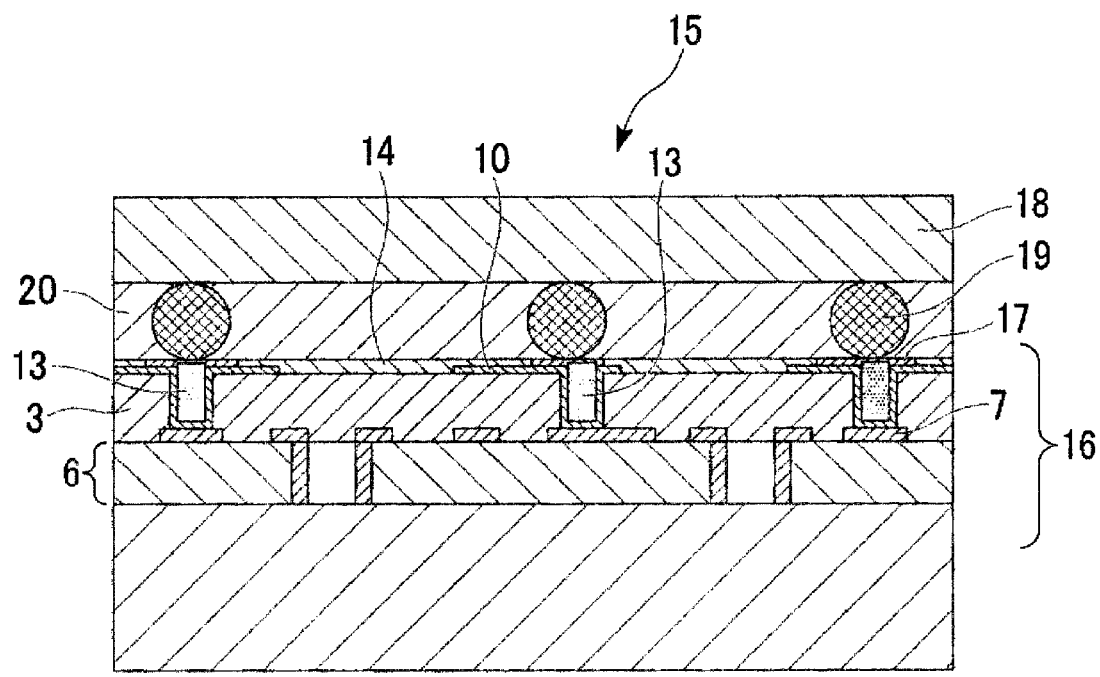
FIG. 4 is a cross-sectional view illustrating a semiconductor device according to the present invention.

FIG. 4 is a cross-sectional view illustrating an example of a semiconductor device 15 according to the present invention.

As shown in FIG. 4, a plurality of connecting electrode portions 17 is formed on one surface of a multi-layer printed circuit board 16. A semiconductor element 18 includes soldering bumps 19 that are provided to correspond to the connecting electrode portions of the multi-layer printed circuit board. The semiconductor element 18 is connected to the multi-layer printed circuit board through the soldering bumps 19. A liquid sealing resin 20 is filled between the multi-layer wiring plate 16 and the semiconductor element 18 to form a semiconductor device. However, in the multi-layer printed circuit board 16, the inner layer circuit 7, the insulating resin layer 3, and the outer layer circuit 10 are formed on the inner layer circuit board 6, and the inner layer circuit 7 and the outer layer circuit 10 are connected to each other by the conductor posts 13. In addition, the outermost layer is covered with the solder resist 14. The soldering bump 19 is preferably made of a tin, lead, silver, copper, or bismuth alloy. The semiconductor element and the multi-layer printed circuit board are connected to each other by a method of using, for example, a flip chip bonder to align the connecting electrode portions on the substrate with the metal bumps of the semiconductor element, heating the soldering bumps at a temperature equal to or higher than a melting point using an IR reflow device, a hot plate, and other heating devices, and bonding the multi-layer printed circuit board on the substrate to the soldering bumps. However, in order to improve connection reliability, it is preferable that a metal layer having a relatively low melting point, such as a solder paste, be formed on the connecting electrode portions on the multi-layer printed circuit board in advance. Before the bonding process, flux may be coated on the outer layers of the soldering bumps and/or the connecting electrode portions on the multi-layer printed circuit board in order to improve connectivity.

Next, the present invention will be described with reference to examples and comparative examples. However, the invention is not limited thereto.

EXAMPLE 1

(1) Adjustment of Varnish 35.0 parts by weight of novolac type cyanate resin (Primaset PT-30 made by Lonza Japan Ltd., and weight-average molecular weight: $7.0 \times 10^2$), 25.0 parts by weight of biphenyl dimethylene type epoxy resin (NC-3000 made by Nippon Kayaku Co., Ltd., epoxy equivalent weight: 275, and weight-average molecular weight: $2.0 \times 10^3$), 5.0 parts by weight of phenoxy resin (jER4275 made by Japan Epoxy Resin Co., Ltd., and weight-average molecular weight: $6.0 \times 10^4$), and 0.1 part by weight of imidazole compound (Curezol 1B2PZ (1-benzyl-2-phenylimidazole) made by Shikoku Chemicals Co., Ltd.) were dissolved in methylethylketone. Here, 2.8 parts by weight of acrylic surfactant (BYK-361N made by BYK-Chemie Japan K. K) having butyl acrylate and 2-ethylhexyl acrylate as a first surfactant was dispersed in a resin. In addition, 32.0 parts by weight of inorganic filler/spherical fused silica (SO-25R made by Admatex Co., Ltd., and average particle diameter: 0.5 µm) and 0.1 part by weight of coupling agent/epoxy silane coupling agent (A-187 made by GE Toshiba Silicon Co., Ltd.) were added, and the mixture was stirred for 10 minutes by a high-speed stirrer to prepare a resin varnish with 50 wt % of solid.

(2) Manufacture of Insulating Resin Sheet with Film

The obtained resin varnish was applied by a comma coater using a polyethylene terephthalate film as a carrier film (SFB-38 made by Mitsubishi Chemical Polyester Film Co., Ltd., thickness; 38 µm, and width: 480 mm) such that the thickness of an insulating resin layer after a drying process was 30 µm. Then, the obtained product was dried for 10 minutes at 160° C. to manufacture an insulating resin sheet with a film.

Next, the manufacture of a multi-layer printed circuit board using the insulating resin sheet with a film obtained in each example and each comparative example will be described.

The obtained insulating resin sheets with films overlapped with the front and rear surfaces of an inner layer circuit board having predetermined inner layer circuits formed on both surfaces thereof, with insulating resin layers facing inward, and vacuum hot pressing was performed on the laminate at a temperature of 100° C. and a pressure of 1 MPa using a vacuum pressure laminator. Then, the laminate was heated and cured at a temperature of 170° C. for 60 minutes by a hot air drier, thereby obtaining a multi-layer printed circuit board.

The following inner layer circuit board was used: a core material: halogen free FR-4 member having a thickness of 0.4 mm; a conductor layer: a copper foil having a thickness of 18 µm, L/S=120/180 µm; clearance holes: 1 mmφ, and 3 mmφ, and slit: 2 mm; an interlayer thickness between the upper and lower circuits: 20 µm (designed value).

Then, the following evaluations were performed on the obtained multi-layer printed circuit board. The evaluation content and items are shown together. The obtained results are shown in Table 1.

TABLE 1

|  | Example 1 | Example 2 | Example 3 | Example 4 | Example 5 | Example 6 | Example 7 | Example 8 | Comparative example 1 | Comparative example 2 |
|---|---|---|---|---|---|---|---|---|---|---|
| PT-30 | 35.0 | 30.0 | 30.0 | 35.0 | 35.0 | 35.0 | 35.0 | 35.0 | 35.0 | 25.0 |
| NC3000 | 25.0 | 25.0 | 30.0 | 20.0 | 25.0 | 25.0 | 25.0 | 25.0 | 25.0 | 25.0 |
| JER4275 | 5.0 |  | 10.0 |  | 5.0 | 5.0 | 5.0 | 5.0 |  |  |
| YX8100H30 |  | 5.0 |  | 5.0 |  |  |  |  | 10.0 | 10.0 |
| IB2PZ | 0.1 | 0.1 | 0.1 | 0.1 | 0.1 | 0.1 | 0.1 | 0.1 | 0.1 | 0.1 |
| SO-25R | 32.0 | 39.0 | 27.0 | 37.0 | 32.0 | 32.0 | 32.0 | 32.0 | 29.8 | 37.0 |
| A-187 | 0.1 | 0.1 | 0.1 | 0.1 | 0.1 | 0.1 | 0.1 | 0.1 | 0.1 | 0.1 |
| BYK-361N | 2.8 | 0.8 |  |  |  | 2.8 | 2.8 | 2.8 |  |  |
| Butyl polyacrylate |  |  | 2.8 |  | 2.1 |  |  |  |  |  |
| 2-ethylhexyl polyacrylate |  |  |  | 2.8 | 0.7 |  |  |  |  |  |
| F-470 |  |  |  |  |  |  |  |  |  | 2.8 |
| Sum | 100.0 | 100.0 | 100.0 | 100.0 | 100.0 | 100.0 | 100.0 | 100.0 | 100.0 | 100.0 |
| Base | Absence | Absence | Absence | Absence | Absence | Absence | Absence | Presence | Absence | Absence |
| Laminating method | Film | Film | Film | Film | Film | Copper foil | Ultrathin copper foil | Film | Film | Film |
| Interlayer thickness [µm] | 20 | 20 | 20 | 21 | 20 | 21 | 19 | 19 | 23 | 15 |
|  | 20 | 19 | 20 | 20 | 20 | 20 | 21 | 20 | 17 | 24 |
|  | 20 | 20 | 20 | 20 | 20 | 20 | 19 | 21 | 21 | 24 |
|  | 20 | 19 | 20 | 21 | 20 | 20 | 20 | 19 | 23 | 12 |
|  | 20 | 19 | 20 | 21 | 20 | 19 | 19 | 21 | 18 | 17 |
| Formability | ○ | ○ | ○ | ○ | ○ | ○ | ○ | ○ | X | X |
| Solder heat resistance | ○ | ○ | ○ | ○ | ○ | ○ | ○ | ○ | X | X |
| Insulating reliability | ○ | ○ | ○ | ○ | ○ | ○ | ○ | ○ | X | X |

1. Interlayer Thickness

The cross section of the obtained multi-layer printed circuit board was observed from a point 4 cm inside the edge of the board at an interval of 8 cm, and the interlayer thickness of the insulating resin layer (from the top of the inner layer circuit to the bottom of the outer layer circuit) was measured at five points.

2. Formability

The surface of the obtained multi-layer printed circuit board was observed to evaluate the formability of the resin layer. Symbols are as follows:

O indicates that repulsion and unevenness did not occur in any samples; and

X indicates that repulsion and unevenness occurred.

3. Evaluation of Solder Heat Resistance

The multi-layer printed circuit board was preprocessed for two hours in an atmosphere of PCT (121° C./100%). Then, the multi-layer printed circuit board was immersed in a soldering bath at a temperature of 260° C. for 30 seconds, and it was evaluated whether or not swelling occurred. In addition, three samples obtained by cutting the multi-layer printed circuit board 50 mm from the edge thereof and grinding the edge with a sand paper #1200 were prepared.

Symbols are as follows:

O indicates that no swelling occurred in any samples; and

X indicates that swelling occurred in at least one sample.

4. Insulating Reliability

The insulating resin sheet with a film was used to manufacture a four-layer printed circuit board for an insulating reliability test in which comb-shaped patterns having a conductor interval of 50 µm were formed on the inner and outer layers, and the insulating resistance thereof was measured by an automatic superinsulating resistance meter (made by Advantest Corporation). Then, a DC voltage of 50 V was applied to the printed circuit board in an atmosphere of HAST (130° C./85%), and the insulation resistance thereof was measured after 96 hours had elapsed. During the measurement, a voltage of 100 V was applied for one minute. As a result, the insulating resistance was $1 \times 10^9 \Omega$ or more, and the printed circuit board passed the test.

Symbols are as follows:

O indicates that the insulating resistance was greater than or equal to $1 \times 10^9 \Omega$; and X indicates that the insulating resistance was less than $1 \times 10^9 \Omega$ In Examples 2 to 4 and Comparative examples 1 and 2, a resin varnish was produced, and an insulating resin sheet with a film and a multi-layer printed circuit board were manufactured and evaluated, similar to Example 1 except that materials were mixed as shown in Table 1. However, in Table 1, YX-8100H30 is a phenoxy resin (made by Japan Epoxy Resin company Co., Ltd., with weight-average molecular weight: $3.0 \times 10^4$)), butyl polyacrylate and 2-ethylhexyl polyacrylate are acrylic surfactants made by Kanto Chemicals Co., Inc., and F-470 is a fluorine-based surfactant (made by Dainippon Ink Chemical Industries).

5. Evaluation of Surface Roughness

The surface roughness (Ra, Rz) was measured by a non-contact three-dimensional light interference type surface roughness meter (WYKO NT1100 made by Veeco Instruments Inc.). As evaluation samples, insulating resin sheet laminates according to Example 1 and Comparative example 1 were used. The obtained results are shown in Table 2.

TABLE 2

|  | Example 1 | Comparative example 1 |
| --- | --- | --- |
| Ra (nm) | 344 | 1650 |
| Rz (µm) | 3.4 | 11.0 |

The surface roughness of the insulating resin layer of the insulating resin sheet was correlated with the amount of void generated in the solder heat resistance evaluation test. As the surface roughness was reduced, the insulating resin sheet flowed more uniformly, and a conductor circuit was more uniformly buried. Therefore, it was possible to uniformly form the insulating resin layer. The amount of void generated tended to be reduced and the solder heat resistance tended to increase.

As can be seen from the results shown in Table 2, the surface roughness of the insulating resin layer of the insulating resin sheet laminate according to Example 1 was about one third of the surface roughness of the insulating resin layer according to Comparative example 1, and the flatness thereof was high. Therefore, the insulating resin layer of the insulating resin sheet laminate according to Example 1 had high solder heat resistance.

As such, since the evaluation sample according to Example 1 had high flatness (low surface roughness), the amount of void generated in the evaluation sample according to Example 1 was smaller than that in the evaluation sample according to Comparative example 1 during a soldering process. Therefore, as can be seen from the results shown in Table 1, it is considered that high adhesion and high insulating reliability between the insulating resin layer and the conductor circuit were obtained.

EXAMPLE 6

An insulating resin layer according to this example was formed by the same method as that in Example 1 except that the insulating resin layer was formed on a 12 µm copper foil, not a film.

EXAMPLE 7

An insulating resin layer according to this example was formed by the same method as that in Example 1 except that the insulating resin layer was formed on a 3 µm ultrathin copper foil with a carrier foil, not a film.

EXAMPLE 8

An insulating resin layer according to this example was formed by the same method as that in Example 1 except that a resin composition was impregnated into a glass fabric (IPC part number: #1015) and the glass fabric was laminated on a film so as to overlap therewith at a temperature of 125° C. and a pressure of 0.5 MPa.

As can be seen from Table 1, in Examples 1 to 8, uniform insulating layers having a thickness error of less than ±10 were obtained. In addition, the insulating layer had high formability and solder heat resistance, and a multi-layer printed circuit board having high insulating reliability was obtained.

In Comparative example 1, the error of the interlayer thickness of the insulating resin layer was greater than that of Examples. This is because minute repulsion or unevenness lowers formability. As a result, for the insulating reliability of the multi-layer printed circuit board, the resistance value thereof in the insulating reliability test was lowered, and an insulating property deteriorated.

As can be seen from Table 2, since the insulating resin layer of the insulating resin sheet laminate was not uniform, the formability of a conductor circuit was insufficient.

In Comparative example 2, large repulsion occurred when the resin composition was coated on a film, which made it difficult to form a film. Therefore, for the insulating reliability of the multi-layer printed circuit board, the resistance value thereof in the insulating reliability test was lowered, and an insulating property deteriorated. The reason for this is as follows. The formability of a conductor circuit is insufficient, and the adhesion between the insulating resin layer and the conductor circuit was lowered due to a fluorine-based surfactant. As a result, the insulating resin layer was peeled off.

INDUSTRIAL APPLICABILITY

According to the present invention, it is possible to provide an insulating resin sheet with a film or a metal foil that is used for a multi-layer printed circuit board having an insulating resin layer with a uniform thickness and suitable for a fine wiring process. In addition, it is possible to provide a multi-layer printed circuit board that uses the insulating resin sheet with a film or a metal foil and has high insulating reliability.

The invention claimed is:

1. An insulating resin sheet laminate, comprising:
a layer comprising one of a film and a metal foil; and
an insulating resin layer comprising a resin composition and formed on the layer comprising one of the film and the metal foil,
wherein the resin composition of the insulating resin layer includes an acrylic surfactant, and the acrylic surfactant is at least one selected from the group consisting of butyl acrylate, butyl polyacrylate, a copolymer of butyl acrylate and 2-ethylhexyl acrylate, 2-ethylhexyl acrylate, and 2-ethylhexyl polyacrylate.

2. The insulating resin sheet laminate according to claim 1, wherein the acrylic surfactant includes 50 wt % or more of butyl acrylate.

3. The insulating resin sheet laminate according to claim 1, wherein the content of the acrylic surfactant in the resin composition is in the range of 0.1 to 10 wt %.

4. The insulating resin sheet laminate according to claim 1, wherein the resin composition includes an epoxy resin.

5. The insulating resin sheet laminate according to claim 4, wherein the epoxy resin is an arylalkylene type epoxy resin.

6. The insulating resin sheet laminate according to claim 1, wherein the resin composition includes an inorganic filler.

7. The insulating resin sheet laminate according to claim 6, wherein the inorganic filler is spherical fused silica.

8. The insulating resin sheet laminate according to claim 1, wherein the resin composition includes at least one of a phenolic hardener and an imidazole hardener.

9. The insulating resin sheet laminate according to claim 1, wherein the resin composition includes a phenoxy resin.

10. The insulating resin sheet laminate according to claim 1, wherein the resin composition includes at least one of a cyanate resin and a prepolymer thereof.

11. The insulating resin sheet laminate according to claim 1, wherein the layer is the film which is a thermoplastic resin film having heat resistance.

12. The insulating resin sheet laminate according to claim 1, wherein the layer is the metal foil which is one of a copper foil and an aluminum foil.

13. The insulating resin sheet laminate according to claim 1, wherein the layer is the metal foil which is a two-layer metal foil having two layers laminated so as to be peeled off from each other and have different thicknesses, and the insulating resin layer is formed on an ultrathin metal foil having a smaller thickness in the two-layer metal foil.

14. The insulating resin sheet laminate according to claim 1, wherein the insulating resin layer has a thickness which is equal to or less than 50μm.

15. The insulating resin sheet laminate according to claim 1, wherein the insulating resin layer includes a base.

16. A multi-layer printed circuit board comprising the insulating resin sheet laminate according to claim 1.

17. The insulating resin sheet laminate according to claim 1, wherein the content of the acrylic surfactant in the resin composition is in the range of 0.3 to 5.0 wt %.

18. The insulating resin sheet laminate according to claim 1, wherein the resin composition includes an epoxy resin in the amount of 1 to 55 wt %.

19. The insulating resin sheet laminate according to claim 1, wherein the resin composition includes a phenoxy resin in the amount of 30 wt % or less.

* * * * *